United States Patent [19]
Maeda et al.

[11] Patent Number: 5,167,758
[45] Date of Patent: Dec. 1, 1992

[54] METHOD OF FORMING POLYCRYSTALLINE SILICON LAYER ON SEMICONDUCTOR WAFER

[75] Inventors: Yasuhiro Maeda; Takashi Yokoyama; Ichiro Hide; Takeyuki Matsuyama; Keiji Sawaya, all of Sapporo, Japan

[73] Assignee: Hoxan Corporation, Sapporo, Japan

[21] Appl. No.: 364,558

[22] Filed: Jun. 8, 1989

[51] Int. Cl.⁵ .............................................. B22D 13/00
[52] U.S. Cl. .................................... 156/624; 156/612; 156/622; 156/DIG. 64; 156/DIG. 83; 156/DIG. 88
[58] Field of Search .................... 156/616 R, 622, 624, 156/DIG. 64, DIG. 83, DIG. 80, DIG. 88

[56] References Cited

U.S. PATENT DOCUMENTS 4,561,486 12/1986 Maeda et al. ................ 156/DIG. 64

FOREIGN PATENT DOCUMENTS 124284 11/1984 European Pat. Off. ............ 156/624
0260359 3/1988 European Pat. Off. .
61-214422 9/1986 Japan .

Primary Examiner—Asok Pal
Attorney, Agent, or Firm—Foley & Lardner

[57] ABSTRACT

A method of forming a polycrystalline silicon layer on a semiconductor wafer is disclosed having the steps of placing the semiconductor wafers in a predetermined number of recesses formed on a mold body, then creating a mold by securing a mold cover in contact with the front surface of the mold body, rotating the mold by a rotor in the heating inert gas of a melting furnace, maintaining the wafer temperature in the range of 1300° C. to 1350° C., pouring heated melted silicon from an inlet opened at the center of the mold cover into a passage recessed at the center of the mold body, flowing the heated melted silicon radially by centrifugal force to fill the melted silicon in a laminated layer air gap formed between the surface of the wafer placed in the recess and the mold cover, cooling to solidify the melted silicon and obtain a product with the polycrystalline silicon layer formed from the melted silicon on the wafer, and opening the mold cover from the mold body to remove the product from the mold body. Thus, the method can readily form an accumulated layer of the thickness of 100 micron at an extremely high speed with sufficient economy.

8 Claims, 3 Drawing Sheets

METHOD OF FORMING POLYCRYSTALLINE SILICON LAYER ON SEMICONDUCTOR WAFER

This application is a continuation-in-part of application Ser. No. 07/172,450, filed Mar. 24, 1988 which is a continuation of Ser. No. 06/909,312, filed Sep. 19, 1989, now both abandoned.

BACKGROUND OF THE INVENTION

This invention relates to a method of laminating a polycrystalline silicon as a lining for forming functional elements such as diodes and transistors or an integrated circuit on the back surface of a single crystal (i.e., monocrystalline semiconductor wafer and dividing the wafer to form chips. The mechanical strength of the wafer is increased and the electric insulation is improved.

Heretofore, a chemical vapor deposition (CVD) method for depositing gaseous silicon on a semiconductor wafer by a thermal decomposition has been employed as a method of laminating a polycrystalline silicon of this type.

According to this method, the growing rate of the accumulated film (a CVD film) is very slow such as several hundred to several thousand angstroms per minute at a substrate temperature of 500° to 600° C. or higher, and the accumulated film thickness of the product obtained for practical use is only as high as 30 to 50 micron from the viewpoints of economy and mass productivity.

Recently, the thickness of a polycrystalline silicon layer is required to be at least 100 micron for protection against alpha-rays in semiconductor functional element to be used in space, but the problem of slow film growing rate cannot suitably meet the demand.

Since the CVD device also has a limit in its size, in case of a semiconductor wafer having a large diameter such as 5 to 8 inches, the conventional CVD device has such disadvantage that the number of wafers to be treated simultaneously is reduced, thereby extremely deteriorating the production efficiency.

SUMMARY OF THE INVENTION

Accordingly, an object of this invention is to provide a method of forming a polycrystalline silicon layer on a semiconductor wafer which can eliminate the above-mentioned drawbacks of the conventional method and can readily form an accumulated layer of the thickness of 100 micron at an extremely high speed with sufficient economy by containing the wafer in a mold of a predetermined construction entirely different from the concept of the conventional CVD method, supplying heated melted silicon thereto while rotating the mold and flowing the melted silicon to a laminated air gap between the preformed wafer and the mold by utilizing centrifugal force created by the rotation.

In order to achieve the above and other objects, there is provided according to this invention a method of forming a polycrystalline silicon layer on a semiconductor wafer comprising the steps of placing the semiconductor wafers in predetermined number of recesses formed on a mold body, then creating a mold by securing a mold cover in contact with the front surface of the mold body, rotating the mold by a rotor in the heating inert gas of a melting furnace, pouring heated melted silicon from an inlet opened at the center of the mold cover into a passage recessed at the center of the mold body, flowing the heated melted silicon radially by centrifugal force to fill the melted silicon in a laminated air gap formed between the surface of the wafer placed in the recess and the mold cover, cooling to solidify the melted silicon and obtain a product with the polycrystalline silicon layer formed from the melted silicon on the wafer, and opening the mold cover from the mold body to remove the product from the mold body.

The above and other related objects and features of the invention will be apparent from a reading of the following description of the disclosure found in the accompanying drawings and the novelty thereof pointed out in the appended claims.

DESCRIPTION OF THE PREFERRED EMBODIMENTS

Figure 1:
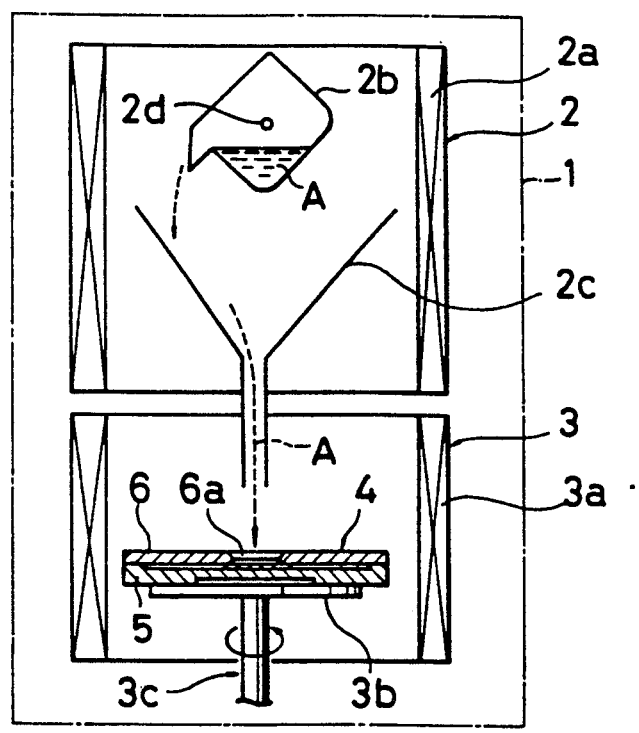
FIG. 1 is a front vertical sectional view showing a melting furnace capable of executing an embodiment of the method of forming a polycrystalline silicon wafer on a semiconductor wafer according to the present invention.

A method of forming a polycrystalline silicon layer on a semiconductor wafer according to an embodiment of this invention will be described in detail with reference to the accompanying drawings, and in case of executing the method, a melting furnace 1 as shown in FIG. 1 may be employed.

The furnace 1 has a melted material supply unit 2 of heated melted silicon A disposed in an upper position, and a lining forming unit 3 of a polycrystalline silicon disposed in a lower position. The supply unit 2 has a heat source 2a of a high-frequency coil, a tiltable crucible 2b pivotally secured to a shaft pin 2d in the furnace, and a funnel 2c disposed in the middle position.

The lining forming unit 3 disposed directly under the supply unit 2 has a preliminary heat source 3a, a rotor 3c having a turntable 3b mounted thereon and driven by a motor (not shown), and a mold 4 placed detachably on the turntable 3b. Inert gas such as argon can be supplied into the furnace 1 to substitute for the air in the furnace 1.

Figure 3A:
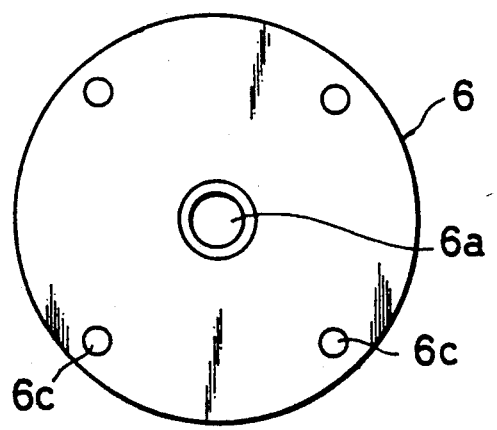
FIGS. 3(a) and 3(b) are a top view and front vertical sectional view respectively, the mold cover of the mold.
Figure 3B:
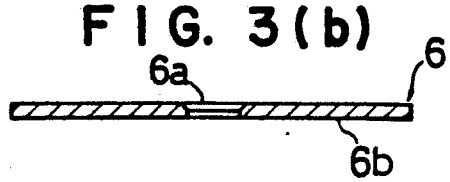
Figure 2A:
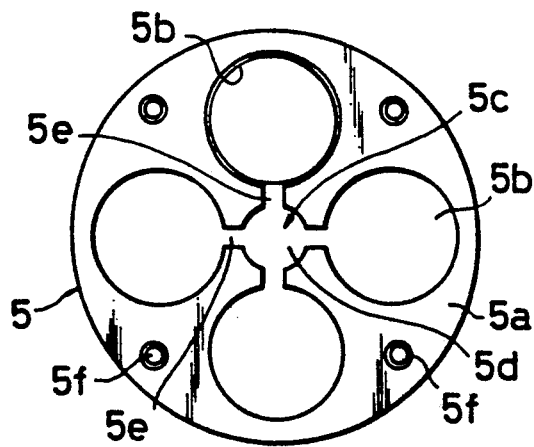
FIGS. 2(a) and 2(b) are a top view and front vertical sectional view respectively of the body of a mold used in the furnace.
Figure 2B:
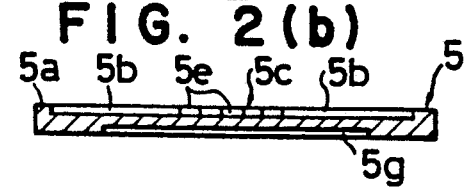
Figure 4:
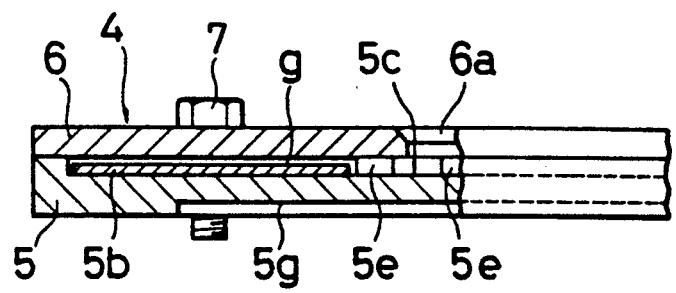
FIG. 4 is a partial front vertical sectional view of the mold.

As shown in FIGS. 2 to 4, the mold 4 is formed of a mold body 5 and a mold cover 6 made, for example, of a high-melting point metal such as carbon graphite or quartz capable of being assembled preferably in a disc shape.

In the exemplified mold 5 as shown, four disc-shaped lining recesses 5b, 5b are formed on the outer periphery of the front surface 5a, a recessed pouring passage 5c is formed at the center of the surface 5a to communicate with the recesses 5b, 5b. The passage 5c has a central passage portion 5d, and branch passage portions 5e, 5e branched from the central passage portion 5d into the recesses 5b, 5b in such a manner that the recesses 5b, 5b are formed in the same depth as the passage 5c. The mold 5 also has threaded mounting holes 5f, 5f to be engaged with clamping bolts as shown in FIG. 4.

As shown in FIG. 3, the mold cover 6 has an inlet 6a perforated at the center thereof. The cover 6 is detachably associated integrally with the mold 5 by placing the back surface 5a of the cover 6 in contact on the front surface 5a of the mold body 5 and engaging the clamping bolts 7 inserted from the holes 6c, 6c of the mold body 5. The mold body 5 has a recess 5g recessed on the back surface of the body 5 to be engaged with the turntable 3b as shown in FIG. 1.

In order to execute the method of the invention with the above-mentioned furnace 1, a mold releasing agent of powder such as $SiO_2$, $Si_3N_4$ or SiC is coated or Si powder is coated on the surfaces of the mold body 5 and the mold cover 6 to be contacted with the heated melted silicon A (i.e., the central passage 5c and the recesses 5b, 5b of the mold body 5, and the entire back surface side of the mold cover 6) and then nitrided to form a film of $Si_3N_4$ so that the silicon A will not react with the molding material.

Then, semiconductor wafers B, B are respectively placed in the recesses 5b, 5b of the mold body 5. In this case, the diameters of the recesses 5b, 5b are defined to be just engaged with the wafers B, B. The mold 4 is closed by placing the mold cover 6 on the mold body 5 and clamping it with the bolts 7. The depths of the recesses 5b, 5b are so formed that a laminated layer air gap g of the thickness equals substantially that of the accumulated layer of the polycrystalline silicon layer to be formed between the wafers B, B and the back surface 6b of the mold cover 6.

After the mold 4 is placed on the rotor 3c by engaging the turntable 3b with the recess 5g, the air in the furnace 1 is substituted by argon gas, and the heat source 2a and the preliminary heat source 3a are operated.

Figure 6:
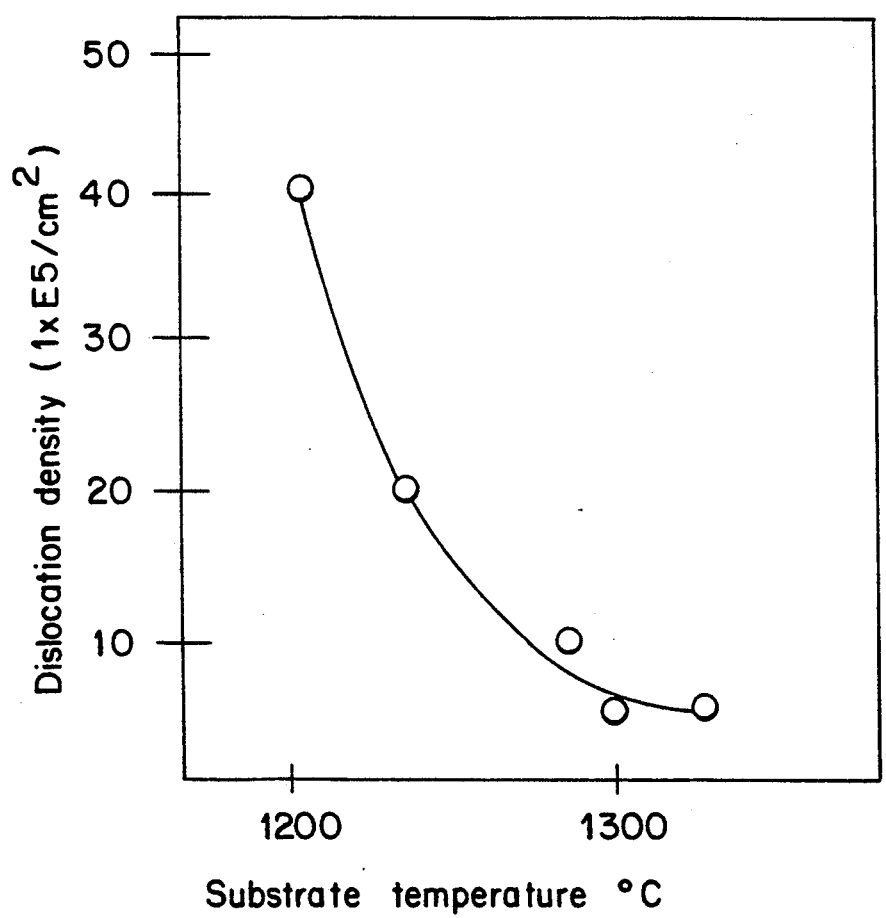
FIG. 6 shows the relationship between dislocation density and the substrate temperature during the process according to the invention.

Thus, the crucible 2b and the funnel 2c are heated. Solid silicon of a raw material contained in advance in the furnace is melted by heating the crucible 2b to approximately 1,430° C. to obtain heated melted silicon A, and the mold 4 is preliminarily heated to 600° to 1,200° C. The substrate temperature during deposition of the molten silicon is maintained within a range of from 1300° C. to 1350° C. This range of 1300° C. to 1350° C. prevents softening of the wafer, while ensuring that molten silicon will stick to the surface of the wafer. That is, if the substrate temperature is more than 1,350° C., the substrate will melt when molten silicon is dropped on the surface, while if it is less than 1,300° C., the dislocation density of the substrate increases, as seen in FIG. 6. By controlling the substrate temperature within this range, an integrated layer is formed that produces a low incidence of dislocation faults.

The rotor 3c is rotated at approximately 450 to 600 r.p.m., and the crucible 2b is tilted around the shaft pin 2d to pour the heated melted silicon A through the funnel 2c into the inlet 6a of the mold 4.

The melted silicon A flows from the inlet 6a into the central passage 5d of the mold body 5 and flows radially outward as a result of the centrifugal force produced by the rotation of the turntable 3b, with the result that the melted silicon A is flowed through the branched passage portions 5e, 5e to the upper surface of the wafers B, B, i.e., to the laminated layer air gap g so that the gap g is completely filled with the melted silicon A. Thus, multiple, stepwise laminations of molten silicon are built up on the surface of the wafer to produce a thick layer. In this way, uneven thicknesses that cause surface irregularity are prevented.

Figure 5A:
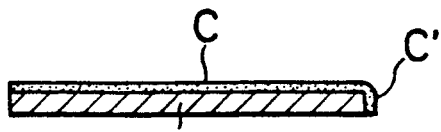
FIGS. 5(a) and 5(b) are vertical front sectional views of polished and nonpolished semiconductor wafers of the product.
Figure 5B:
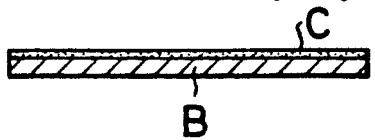

Then, the heat source 2a, the preliminary heat source 3a and the rotor 3c are stopped. When they are cooled to approximately 500° C., the mold 4 is removed from the furnace 1, and the mold cover is removed from the mold 4. Thus, as shown in FIG. 5, products formed with polycrystalline silicon layer C on the back surfaces of the wafers B are provided.

In this case, excessive polycrystalline silicon C' is coated on the peripheral end of the wafer B, and can be readily removed by polishing as required.

When polycrystalline silicon layers were actually formed according to the above-mentioned method of the present invention. The time from the flowing down of melted silicon A from the inlet to stopping of the rotor was 15 seconds, and 100 micron of polycrystalline silicon layer could be formed.

This means that 400 micron-thick polycrystalline silicon layer can be produced in one minute. In comparison, according to the conventional CVD method, the forming rate is several thousand angstrom per minute at the maximum. Therefore, the present invention can provide approximately 100 times the conventional method.

According to the method of the invention as described above, the polycrystalline silicon layer can be formed much faster than the conventional CVD method, a mass production can be carried out with a small-sized furnace and a number of products can be produced simultaneously.

Further, not only is the production of polycrystalline silicon layer much faster, but also the polycrystalline silicon layer of the thickness of 100 micron or larger is readily employed for the formation of lined layer of individual elements to be formed on the wafer, integrated circuit and V-shaped MOS IC and the poor yield based on the insufficient mechanical strength in the conventional products can be remarkably improved. High integration MOS IC and space semiconductor functional elements can be readily manufactured.

What is claimed is:

1. A method of forming a polycrystalline silicon layer on a semiconductor wafer comprising the steps of:
    placing at least one monocrystalline silicon semiconductor wafer in a recess formed on a mold body,
    creating a mold by securing a mold cover in contact with the front surface of the mold body, forming an air gap between the surface of the wafer placed in the recess and the mold cover,
    rotating the mold by a rotor in the heating inert gas of a melting furnace,
    maintaining the temperature of the wafer between 1300° and 1350° C.,
    pouring the heated melted silicon from an inlet opened at the center of the mold cover into a passage recessed at the center of the mold body,
    flowing the heated melted silicon radially by centrifugal force created by the rotation of the rotor to fill the melted silicon in a laminated layer in the air gap formed between the surface of the wafer placed in the recess and the mold cover,
    cooling to solidify the melted silicon to obtain a product with a polycrystalline silicon layer formed from the melted silicon on the wafer, and
    opening the mold cover to remove the product from the mold body, wherein the product has a dislocation density of less than about $10^6$ defects/cm$^2$ and can be used in the manufacture of semiconductor functional elements.

2. The method according to claim 1, wherein said heated melted silicon is obtained by melting solid silicon by the heat source of said furnace, and the mold rotated by a rotor is preheated by a preliminary heat source of said furnace.

3. The method according to claim 1, wherein a mold releasing powder selected from the group consisting of $SiO_2$, $Si_3N_4$ SiC and Si is coated on the surfaces of the mold body and the mold cover to be contacted with the heated melted silicon, and then nitrided to form $Si_3N_4$.

4. The method according to claim 3, wherein after the mold is placed on the rotor by engaging a turntable with the recess of the mold, the air in the furnace is substituted by argon gas, and the heat source and the preliminary heat source are operated.

5. The method according to claim 4, wherein the melted silicon raw material is melted by heating to substantially 1,430° C., and the mold is heated to 600° to 1,200° C.

6. The method according to claim 5, wherein the rotor is rotated at substantially 450 to 600 r.p.m.

7. The method according to claim 1, wherein the mold is preliminarily heated to 600° to 1200° C.

8. The method according to claim 1, wherein the rotor is rotated at substantially 450 to 600 r.p.m.

* * * * *